US011800754B2

(12) United States Patent
Moon et al.

(10) Patent No.: US 11,800,754 B2
(45) Date of Patent: Oct. 24, 2023

(54) DISPLAY APPARATUS

(71) Applicant: SAMSUNG DISPLAY CO., LTD., Yongin-si (KR)

(72) Inventors: Sungjae Moon, Yongin-si (KR); Dongwoo Kim, Yongin-si (KR); Junhyun Park, Yongin-si (KR); Ansu Lee, Yongin-si (KR); Kangmoon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 311 days.

(21) Appl. No.: 16/596,877

(22) Filed: Oct. 9, 2019

(65) Prior Publication Data

US 2020/0119115 A1 Apr. 16, 2020

(30) Foreign Application Priority Data

Oct. 10, 2018 (KR) .................. 10-2018-0120609

(51) Int. Cl.
*H10K 59/127* (2023.01)
*G09G 3/3266* (2016.01)
(Continued)

(52) U.S. Cl.
CPC ......... *H10K 59/127* (2023.02); *G09G 3/3266* (2013.01); *G09G 3/3291* (2013.01);
(Continued)

(58) Field of Classification Search
CPC ............. H01L 27/3251; H01L 27/3265; H01L 27/3276; H01L 27/3211; H01L 27/3216;
(Continued)

(56) References Cited

U.S. PATENT DOCUMENTS 8,866,705 B2 10/2014 Takasugi et al.
9,217,905 B2 12/2015 Xia et al.
(Continued)

FOREIGN PATENT DOCUMENTS

KR 10-2013-0047483 A 5/2013
KR 10-2014-0037715 3/2014
(Continued)

OTHER PUBLICATIONS

Korean Notice of Allowance for Korean Patent Application No. 10-2018-0120609, dated Apr. 24, 2023.

*Primary Examiner* — Latanya N Crawford Eason
(74) *Attorney, Agent, or Firm* — KILE PARK REED & HOUTTEMAN PLLC

(57) ABSTRACT

A display apparatus having an opening ratio that provides a high resolution and improved luminous quality and including: a substrate; a first driving thin-film transistor (TFT) and a first storage capacitor, the first storage capacitor for emitting light of a first color and on the substrate; a data wiring unit including a first data line, a second data line, and a third data line, at a first side of the first storage capacitor, extending along a first direction and spaced apart from one another along a second direction, intersecting the first direction, by a predetermined distance; a driving voltage line at a second side of the first storage capacitor and extending along the first direction; and a first pixel electrode electrically connected to the first driving TFT.

20 Claims, 9 Drawing Sheets

(51) Int. Cl.
*G09G 3/3291* (2016.01)
*H10K 59/131* (2023.01)
*H10K 59/121* (2023.01)

(52) U.S. Cl.
CPC ....... *H10K 59/1216* (2023.02); *H10K 59/131* (2023.02); *G09G 2300/0426* (2013.01)

(58) Field of Classification Search
CPC ............. H01L 51/5209; H01L 51/5225; H01L 27/3274; H01L 27/3279; H01L 27/3262; H01L 27/326; G09G 3/3266; G09G 2300/0426; G09G 3/3291; H10K 59/12; H10K 59/131; H10K 59/127; H10K 59/1216
See application file for complete search history.

(56) References Cited

U.S. PATENT DOCUMENTS

| | | | |
|---|---|---|---|
| 9,299,730 | B2 | 3/2016 | Lee et al. |
| 9,893,136 | B2 | 2/2018 | Byun et al. |
| 10,084,030 | B2 | 9/2018 | Oh et al. |
| 2016/0240603 | A1* | 8/2016 | Park ...................... G09G 3/3225 |
| 2017/0162637 | A1* | 6/2017 | Choi ....................... H01L 21/28 |
| 2017/0194402 | A1* | 7/2017 | Choi ................... H01L 27/3246 |

FOREIGN PATENT DOCUMENTS

| | | |
|---|---|---|
| KR | 10-1442713 B1 | 9/2014 |
| KR | 10-2016-0092183 | 8/2016 |
| KR | 10-2016-0100012 | 8/2016 |
| KR | 10-2017-0012767 | 2/2017 |
| KR | 10-2017-0066767 | 6/2017 |
| KR | 10-2017-0080201 A | 7/2017 |
| KR | 10-2017-0080233 A | 7/2017 |
| KR | 10-2017-0124065 | 11/2017 |

* cited by examiner

DISPLAY APPARATUS

CROSS-REFERENCE TO RELATED APPLICATION

Korean Patent Application No. 10-2018-0120609, filed on Oct. 10, 2018, in the Korean Intellectual Property Office, and entitled: "Display Apparatus," is incorporated by reference herein in its entirety.

BACKGROUND

1. Field

One or more embodiments relate to a display apparatus.

2. Description of the Related Art

Organic light-emitting display apparatuses typically include a thin-film transistor (TFT) and organic light-emitting devices on a substrate. Organic light-emitting devices emit light by themselves. Such organic light-emitting display devices are used for display units of various sizes, e.g., for a small product, e.g., a mobile phone, or for a large product, e.g., a television.

There is demand for display apparatuses having high resolution. However, in display apparatuses according to the related art, an opening ratio is decreased by pixel arrangement, and luminous quality is lowered due to an increase in loads applied to wirings as the resolution of a display apparatus increases.

SUMMARY

According to one or more embodiments, a display apparatus includes: a substrate; a first driving thin-film transistor (TFT) and a first storage capacitor for emitting a light of a first color and on the substrate; a data wiring unit including a first data line, a second data line, and a third data line, at a first side of the first storage capacitor, extending along a first direction and are spaced apart from one another along a second direction that intersects the first direction by a predetermined distance; a driving voltage line at a second side of the first storage capacitor and extending along the first direction; and a first pixel electrode electrically connected to the first driving TFT.

On a plane, the first pixel electrode may have a short axis in the first direction and a long axis in the second direction.

The first pixel electrode may overlap the data wiring unit.

The first pixel electrode may overlap the first data line, the second data line, and the third data line.

The display apparatus may further include a first switching TFT for emitting light of a first color and connected to the first data line.

The display apparatus may further include a common voltage line at the second side of the first storage capacitor, spaced apart from the driving voltage line by a predetermined distance and extending along the first direction.

The display apparatus may further include a first conductive layer below the common voltage line and connected to the common voltage line via a contact hole.

The display apparatus may further include a second conductive layer below the driving voltage line and connected to the driving voltage line via a contact hole.

The first conductive layer and the second conductive layer may include same materials.

The display apparatus may further include an initialization voltage line between the driving voltage line and the common voltage line, and extending along the first direction.

The display apparatus may further include: a second driving TFT for emitting a light having a second color, a second storage capacitor, and a second pixel electrode electrically connected to the second driving TFT; and a third driving TFT for emitting a light having a third color, a third storage capacitor, and a third pixel electrode electrically connected to the third driving TFT, wherein, on a plane, the second storage capacitor and the third storage capacitor are between the data wiring unit and the driving voltage line.

The driving voltage line may supply a same driving voltage to the first driving TFT, the second driving TFT, and the third driving TFT.

Each of the second pixel electrode and the third pixel electrode may have a short axis in the first direction and a long axis in a second direction that intersects with the first direction and extends in the second direction.

The display apparatus may further include a scan line and a sensing line extending in the second direction, wherein the scan line does not overlap the first pixel electrode.

The display apparatus may further include: a first extension line extending in the first direction from the scan line; and a first switching TFT including a first switching semiconductor layer for emitting light of a first color, a second switching TFT including a second switching semiconductor layer for emitting light of a second color, and a third switching TFT including a third switching semiconductor layer for emitting light of a third color, wherein at least a portion of the first extension line overlaps the first switching semiconductor layer, the second switching semiconductor layer, and the third switching semiconductor layer.

The display apparatus may further include: a second extension line extending in the first direction from the sensing line; and a first sensing TFT including a first sensing semiconductor layer for emitting light of a first color, a second sensing TFT including a second sensing semiconductor layer for emitting light of a second color, and a third sensing TFT including a third sensing semiconductor layer for emitting light of a third color, wherein at least a portion of the second extension line overlaps the first sensing semiconductor layer, the second sensing semiconductor layer, and the third sensing semiconductor layer.

The display apparatus may further include an insulating layer including a first opening covering edges of the first pixel electrode and exposing a central part thereof, a second opening covering edges of the second pixel electrode and exposing a central part thereof, and a third opening covering edges of the third pixel electrode and exposing a central part thereof, wherein a width of the insulating layer between the first opening and the second opening in the first direction is same as a width of the insulating layer between the second opening and the third opening in the first direction.

The display apparatus may further include: an intermediate layer including a first color emission layer on the first pixel electrode; an opposite electrode on the intermediate layer; and an auxiliary electrode at a first side or a second side of the first pixel electrode and electrically connected to the common voltage line, wherein the auxiliary electrode is electrically connected to the opposite electrode.

The insulating layer may further include a first hole exposing a central part of the auxiliary electrode, and the intermediate layer may further include a second hole exposing at least a portion of the auxiliary electrode via the first hole, and the auxiliary electrode may be electrically connected to the opposite electrode via the first hole and the second hole.

According to one or more embodiments, a display apparatus includes a pixel unit including a first pixel for emitting light of a first color, a second pixel for emitting light of a second color, and a third pixel for emitting light of a third color. The pixel unit may further include a storage unit including a first storage capacitor for emitting light of a first color, a second storage capacitor for emitting light of a second color, and a third storage capacitor for emitting light of a third color. A data wiring unit may be at a first side of the storage unit, extending along the first direction and including a first data line for transmitting a data signal to the first pixel, a second data line for transmitting a data signal to the second pixel, and a third data line for transmitting a data signal to the third pixel. A driving voltage line may be at a second side of the storage unit, extending along the first direction and supplying a driving power to the first pixel, the second pixel, and the third pixel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
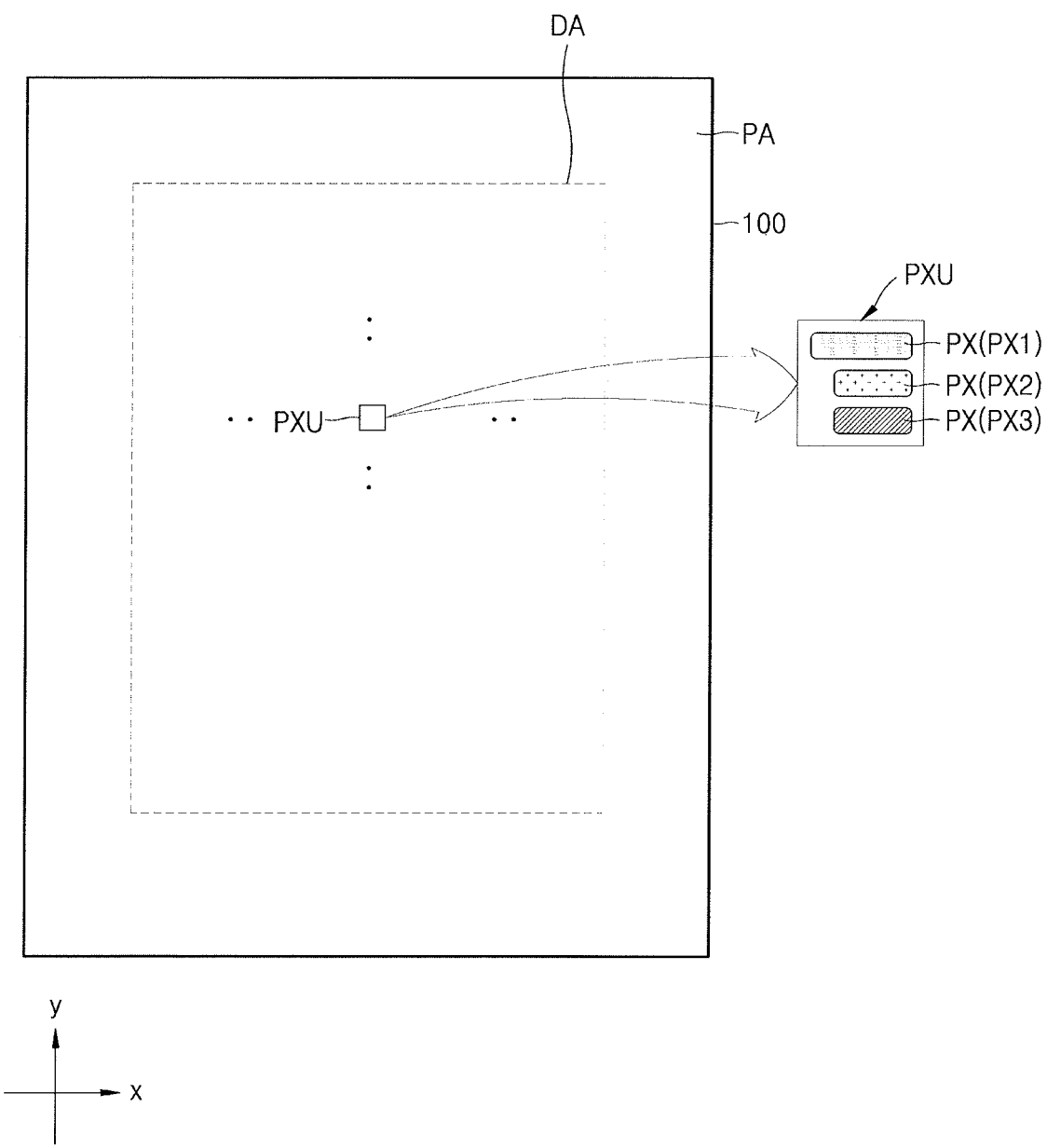
FIG. 1 illustrates a display apparatus according to an embodiment.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described below in more detail with reference to the accompanying drawings. The same reference numerals are used for components that are the same or are in correspondence, and a detailed description thereof will be omitted.

It will be understood that although the terms "first", "second", etc. may be used herein to describe various components, these components should not be limited by these terms. These components are only used to distinguish one component from another. As used herein, the singular forms "a", "an" and "the" are intended to include the plural forms as well, unless the context clearly indicates otherwise.

It will be further understood that the terms "includes" and/or "including" used herein specify the presence of stated features or components, but do not preclude the presence or addition of one or more other features or components. It will be understood that when a layer, area, or component is referred to as being "formed on," another layer, area, or component, it may be directly or indirectly formed on the other layer, area, or component. That is, for example, intervening layers, areas, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another, but that intersect one another. Further, when two elements overlap each other, it means that the two constituent elements overlap each other along the z-axis direction, e.g., in a direction perpendicular to an upper side of a substrate.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

FIG. 1 is a plan view of a display apparatus according to an embodiment. Referring to FIG. 1, a display apparatus includes a substrate 100. The substrate 100 has a display area DA and a peripheral area PA outside the display area DA.

Pixel units PXU including various display devices, such as organic light-emitting devices (OLEDs), may be arranged in the display area DA of the substrate 100. Each of the pixel units PXU may include at least one pixel. Each of the pixel units PXU according to the current embodiment includes a plurality of pixels PX1, PX2, and PX3. Each of the plurality of pixels PX1, PX2, and PX3 may emit light having different colors. For example, a first pixel PX1 may emit light of a first color, a second pixel PX2 may emit light of a second color, and a third pixel PX3 may emit light of a third color. In this case, the first color may be red, the second color may be green, and the third color may be blue. According to implementations, any three colors that can be combined to generate white light may be used. Also, in the current embodiment, the plurality of pixels PX1, PX2, and PX3 of the pixel unit PXU may be arranged in stripes. In other implementations, the plurality of pixels PX1, PX2, and PX3 of the pixel unit PXU may also be arranged in other ways, e.g., pentiles.

Various wirings for transmitting electrical signals to be applied to the display area DA may be in the peripheral area PA of the substrate 100. Hereinafter, for conveniences, a display apparatus including an OLED as a display device will be described, but the arrangement herein may be applied to other types of display devices.

Figure 2:
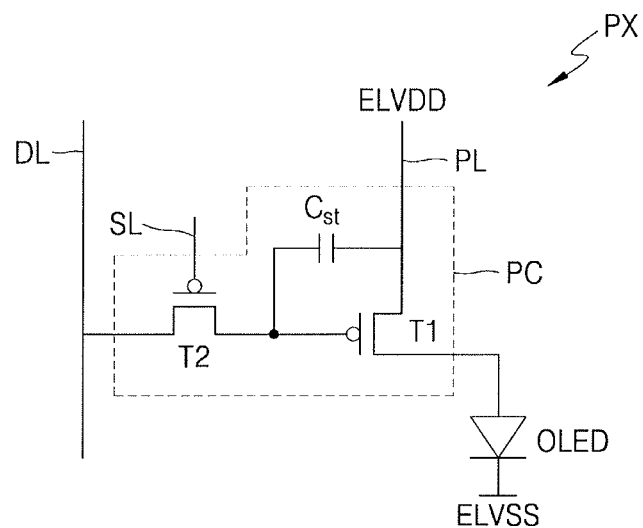
FIG. 2 illustrates an equivalent circuit diagram of one pixel of the display apparatus according to an embodiment.
Figure 3:
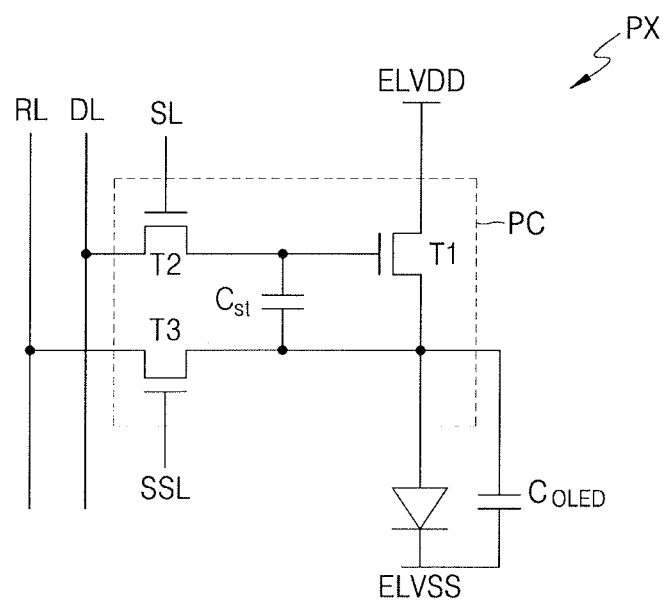
FIG. 3 illustrates an equivalent circuit diagram of one pixel of a display apparatus according to another embodiment.

FIGS. 2 and 3 are equivalent circuits of one pixel of a display apparatus according to embodiments.

Referring to FIG. 2, a pixel includes a pixel circuit PC and a display device connected to the pixel circuit PC. The pixel of FIG. 2 is one among a plurality of pixels PX1, PX2, and PX3. In FIG. 2, an OLED is illustrated as a display device. The pixel circuit PC may include a first thin-film transistor (TFT) T1, a second TFT T2, and a storage capacitor Cst. In the pixel circuit PC of FIG. 2, the first TFT T1 and the second TFT T2 are P-types, but may be N-types.

The first TFT T1 is a driving TFT connected to a driving voltage line PL and the storage capacitor Cst. The first TFT T1 may control a driving current $I_d$ that flows through the OLED from the driving voltage line PL in correspondence to a voltage value stored in the storage capacitor Cst. The OLED may emit light having predetermined luminance due to the driving voltage $I_d$. A second power supply voltage ELVSS may be supplied to an opposite electrode of the OLED, e.g., a cathode.

The second TFT T2 is a switching TFT connected to a scan line SL and a data line DL. The second TFT T2 may transmit a data voltage input from the data line DL to the first TFT T1 according to a switching voltage input to a gate electrode of the TFT T2 from the scan line SL. The storage capacitor Cst is connected to the second TFT 12 and the driving voltage line PL and may store a voltage that corresponds to a difference between a voltage transmitted from the second TFT T2 and a first power supply voltage ELVDD supplied to the driving voltage line PL.

In FIG. 2, the pixel circuit PC includes two TFTs and one storage capacitor. In some implementations, the number of TFTs and the number of storage capacitors may be changed in various ways according to a design of the pixel circuit PC.

In another embodiment, referring to FIG. 3, a pixel circuit PC of FIG. 3 may include the first TFT T1, the second TFT T2, a third TFT T3, and the storage capacitor Cst. In the pixel circuit PC of FIG. 3, the first TFT T1, the second TFT T2, and the third TFT T3 are N-types but may be P-types.

Similarly to FIG. 2, the first TFT T1 is a driving TFT, the second TFT 12 is a switching TFT, and the pixel circuit PC of FIG. 3 may further include a compensation circuit including the third TFT T3. The compensation circuit is added to compensate for a threshold voltage of the driving TFT and may include one or more TFTs.

The third TFT T3 is a sensing TFT and includes a gate electrode connected to a sensing line SSL, a first connection electrode, i.e., a source electrode connected to a reference line RL, and a second connection electrode, i.e., a drain electrode connected to the OLED. The third TFT 13 operates to supply an initialization voltage (or a sensing voltage) transmitted via the reference line RL to a sensing node of the first TFT T1 or to sense a voltage or current of the sensing node of the first TFT T1 or the reference line RL.

An operating time of the third TFT T3 may be the same as, similar to or different from that of the second TFT T2 according to a configuration of an external compensation algorithm (or a compensation circuit). That is, as in the present embodiment, the second TFT T2 may have a gate electrode connected to the scan line SL and the third TFT T3 may have a gate electrode connected to the sensing line SSL. In another implementation, the scan line SL connected to the gate electrode of the second TFT T2 and the sensing line SSL is to the gate electrode of the third TFT T3 may be connected to each other so as to be commonly shared.

Figure 4:
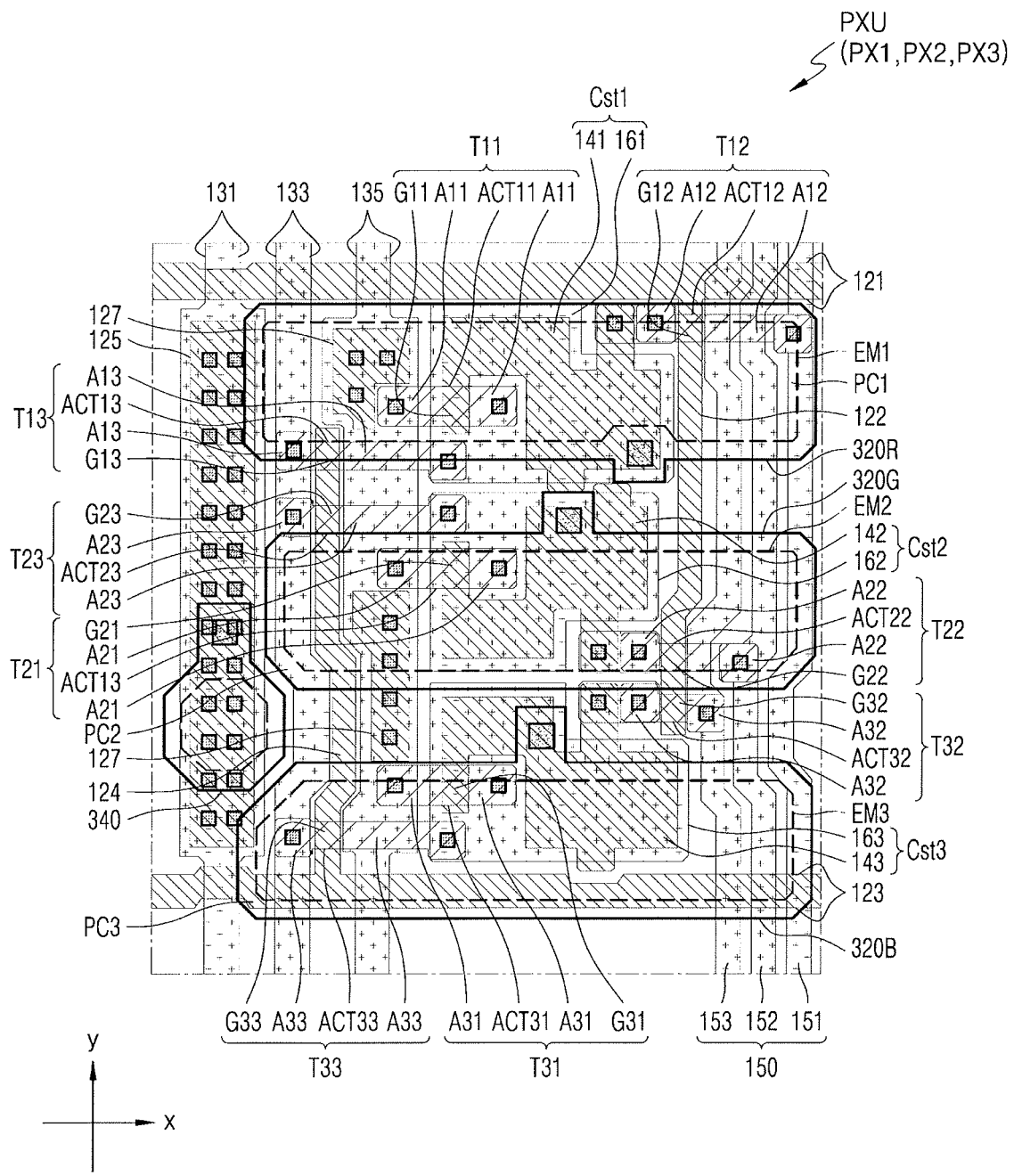
FIG. 4 illustrates a layout diagram of a pixel unit including a pixel circuit of FIG. 3.

Hereinafter, the case where a pixel PX of the display apparatus according to an embodiment includes the pixel circuit PC of FIG. 3 will be described. FIG. 4 is a layout diagram of a pixel unit PXU including a pixel circuit of FIG. 3, FIGS. 5 through 8 are layout diagrams of components of a pixel circuit of FIG. 4 stacked along the stacked direction (z-axis direction or third direction), and FIG. 9 is a cross-sectional view of a stacked structure of a pixel of a display apparatus according to an embodiment. Hereinafter, a detailed structure of the pixel unit PXU illustrated in FIG. 3 will be described with reference to FIGS. 4 through 9.

Each of FIGS. 5 through 8 illustrates the arrangement of wirings, electrodes, and semiconductor layers formed in the same layer. Insulating layers may be between layers illustrated in FIGS. 5 through 8. For example, a gate insulating layer (see 103 of FIG. 9) is interposed between a layer of FIG. 5 and a layer of FIG. 6, and an interlayer insulating layer (see 105 of FIG. 10) is between a layer of FIG. 6 and a layer of FIG. 7, and a planarization insulating layer (see 107 of FIG. 10) is between a layer of FIG. 7 and a layer of FIG. 8. An insulating layer (see 109 of FIG. 10) for defining emission areas of a pixel is on a layer illustrated in FIG. 8. Layers illustrated in FIGS. 5 through 8 may be electrically connected to each other through contact holes defined in at least a portion of the above-described insulating layers.

Referring to FIG. 4, the pixel unit PXU includes a first pixel PX1, a second pixel PX2, and a third pixel PX3. Each of the first through third pixels PX1, PX2, and PX3 may include one or more TFT and a storage capacitor. In the present embodiment, the first pixel PX1 may include a first driving TFT T11 including a first driving semiconductor layer ACT11, a first driving gate electrode G11, and a first driving connection electrode A11; a first switching TFT T12 including a first switching semiconductor layer ACT12, a first switching gate electrode G12, and a first switching connection electrode A12; and a first sensing TFT T13 including a first sensing semiconductor layer ACT13, a first sensing gate electrode G13, and a first sensing connection electrode A13.

The second pixel PX2 may include a second driving TFT T21 including a second driving semiconductor layer ACT21, a second driving gate electrode G21, and a second driving connection electrode A21; a second switching TFT T22 including a second switching semiconductor layer ACT22, a second switching gate electrode G22, and a second switching connection electrode A22: and a second sensing TFT T23 including a second sensing semiconductor layer ACT23, a second sensing gate electrode G23, and a second sensing connection electrode A23.

The third pixel PX3 may include a third driving TFT T31 including a third driving semiconductor layer ACT31, a third driving gate electrode G31, and a third driving connection electrode A31; a third switching TFT T32 including a third switching semiconductor layer ACT32, a third switching gate electrode G32, and a third switching connection electrode A32; and a third sensing TFT T33 including a third sensing semiconductor layer ACT33, a third sensing gate electrode G33, and a third sensing connection electrode A33. The "connection electrode" may mean a source electrode or a drain electrode.

The pixel unit PXU includes a data wiring unit 150, a common voltage line 131, an initialization voltage line 133, and a driving voltage line 135, which extend along a column direction (y-direction or first direction) and apply a data signal, a common voltage ELVSS, an initialization voltage, and a driving voltage ELVDD, respectively. The initialization voltage line 133 may be connected to the third TFT T3 and may operate as the reference line RL (see FIG. 3). The pixel unit PXU includes a scan line 121 and a sensing line 123, which intersect with the data wiring unit 150, apply each of a scan signal and a sensing signal and extend along a row direction (x-direction or second direction).

In the current embodiment, the data wiring unit 150 includes a first data line 151 for supplying a data signal to the first pixel PX1, a second data line 152 for supplying a data signal to the second pixel PX2, and a third data line 153 for supplying a data signal to the third pixel PX3. The data wiring unit 150 may be on a first side of the pixel unit PXU. The driving voltage line 135 is not separately provided is each pixel, but may be a single wiring to apply the driving voltage ELVDD to the first pixel PX1, the second pixel PX2, and the third pixel PX3 simultaneously. Thus, a space may be more efficiently used to provide a high resolution.

The pixel PX includes TFTs (see T1 through T3 of FIG. 3), a storage capacitor Cst, and an OLED (see 300 of FIG. 9) electrically connected to the TFTs and the storage capacitor Cst. Hereinafter, for convenience, a description thereof will be provided according to a stack sequence along a stacking direction (z-direction or third direction).

Figure 5:
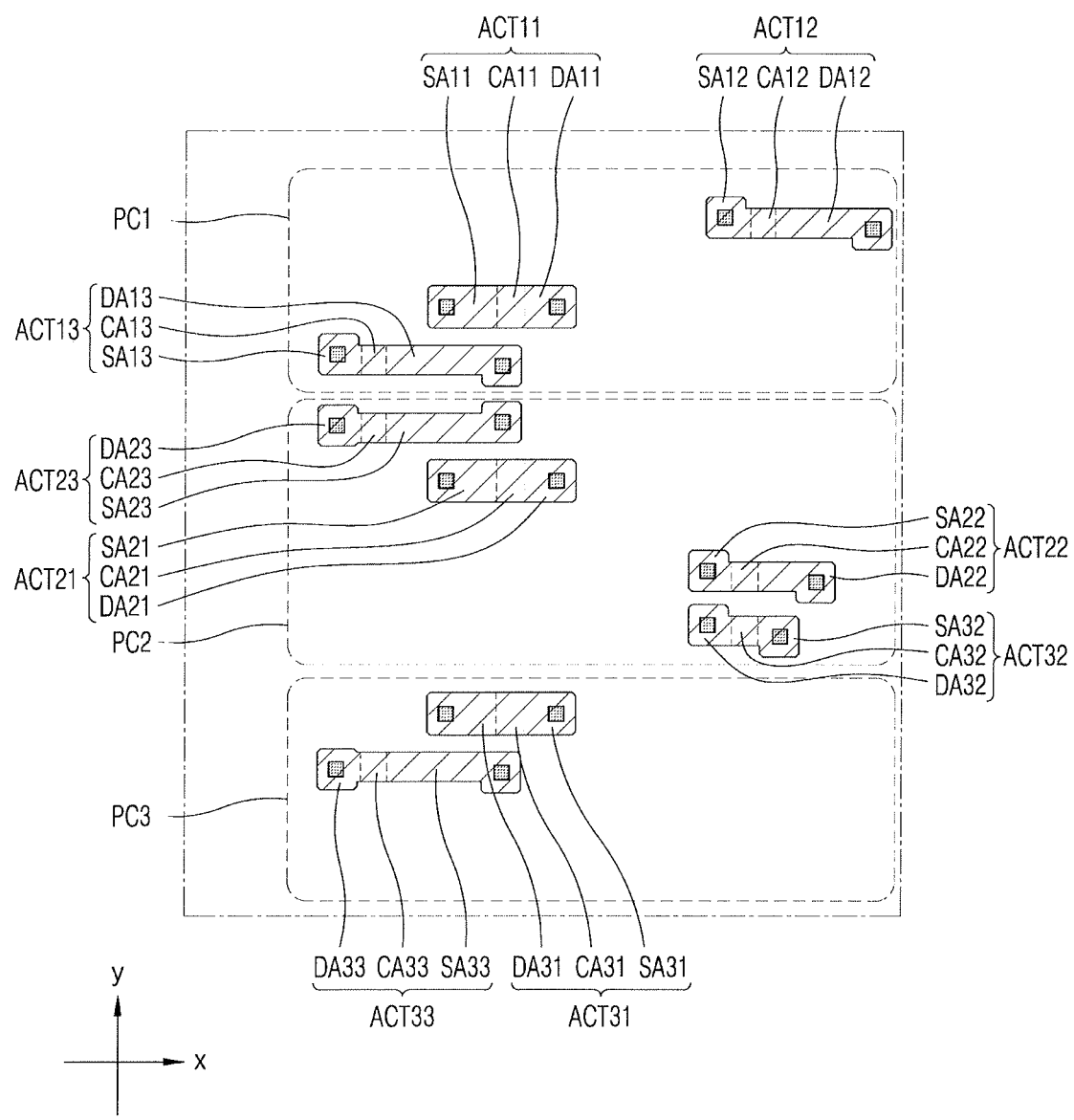
FIGS. 5 through 8 illustrate layout diagrams of components of a pixel circuit of FIG. 4 according to layers.

Referring to FIGS. 4, 5, and 9, a first pixel circuit PC1 of the first pixel PX1 includes the first driving TFT T11, the first switching TFT T12, and the first sensing TFT T13; a second pixel circuit PC2 of the second pixel PX2 includes the second driving TFT T21, the second switching TFT T22, and the second sensing TFT T23; and a third pixel circuit PC3 of the third pixel PX3 includes the third driving TFT T31, the third switching TFT T32, and the third sensing TFT T33. The first, second, and third driving TFTs T11, T21, and T31, the first, second, and third switching TFTs T12, T22, and T32, and the semiconductor layers ACT11, ACT12, ACT13, ACT21, ACT22, ACT23, ACT31, ACT32, and ACT33 (hereinafter, referred to as ACTS) of the first, second, and third sensing TFTs 113, 123, and T33 are arranged on the same layer.

The semiconductor layers ACTS are on a buffer layer 101 on a substrate 100. The substrate 100 may be formed of a glass material, a metallic material, or a plastic material, e.g., polyethylene terephthalate (PET), polyethylene naphthalate (PEN), polyimide, or the like. The buffer layer 101 may be formed of an oxide layer, e.g., silicon oxide (SiOx) and/or a nitride layer, such as silicon nitride (SiNx), or the like.

The semiconductor layers ACTS may include polycrystalline silicon.

Alternatively, the semiconductor layers ACTS may include amorphous silicon, an oxide semiconductor layer, e.g., a G-I-Z-O layer [$(In_2O_3)a(Ga_2O_3)b(ZnO)c$ layer] (where a, b, and c are real numbers that satisfy conditions of a≥0, b≥0, and c>0, respectively), or the like. Hereinafter, for convenience, semiconductor layers ACTS including polycrystalline silicon will be described.

The semiconductor layers ACTS may include a channel area, with a source area and a drain area at both sides of the channel area. In an example, the source area and the drain area may be doped with an impurity, e.g., an N-type impurity or a P-type impurity. The source area and the drain area may be a source electrode and a drain electrode, respectively, and may be connected to layers of FIG. 7.

The first driving semiconductor layer ACT11 may include a first driving channel area CA11, and a first driving source area SA11 and a first driving drain area DA11 at both sides of the first driving channel area CA11. The first switching semiconductor layer ACT12 may include a first switching channel area CA12, and a first switching source area SA12 and a first switching drain area DA12 at both sides of the first switching channel area CA12. The first sensing semiconductor layer ACT13 may include a first sensing channel area CA13, and a first sensing source area SA13 and a first sensing drain area DA13 at both sides of the first sensing channel area CA13.

The second driving semiconductor layer ACT21 may include a second driving channel area CA21, and a second driving source area SA21 and a second driving drain area DA21 at both sides of the second driving channel area CA21. The second switching semiconductor layer ACT12 may include a second switching channel area CA12, and a second switching source area SA12 and a second switching drain area DA12 at both sides of the second switching channel area CA12. The second sensing semiconductor layer ACT13 may include a second sensing channel area CA13, and a second sensing source area SA13 and a second sensing drain area DA13 at both sides of the second sensing channel area CA13.

The third driving semiconductor layer ACT31 may include a third driving channel area CA31, and a third driving source area SA31 and a third driving drain area DA31 at both sides of the third driving channel area CA31. The third switching semiconductor layer ACT32 may include a third switching channel area CA32, and a third switching source area SA32 and a third switching drain area DA32 at both sides of the third switching channel area CA32. The third sensing semiconductor layer ACT33 may include a third sensing channel area CA33, and a third sensing source area SA33 and a third sensing drain area DA33 at both sides of the third sensing channel area CA33.

A shielding layer (see 217 of FIG. 9) including metal may be below the semiconductor layers ACTS, e.g., between the substrate 100 and the semiconductor layers ACTS. The shielding layer 217 serves to block light incident onto the substrate 100 in a top emission display apparatus. The buffer layer 101 may be between a semiconductor layer 120 and the shielding layer 217.

A gate insulating layer 103 may be on the semiconductor layers ACTS. The gate insulating layer 103 may include an inorganic material, e.g., an oxide, a nitride, and the like. For example, the gate insulating layer 103 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_2$), and the like.

Figure 6:
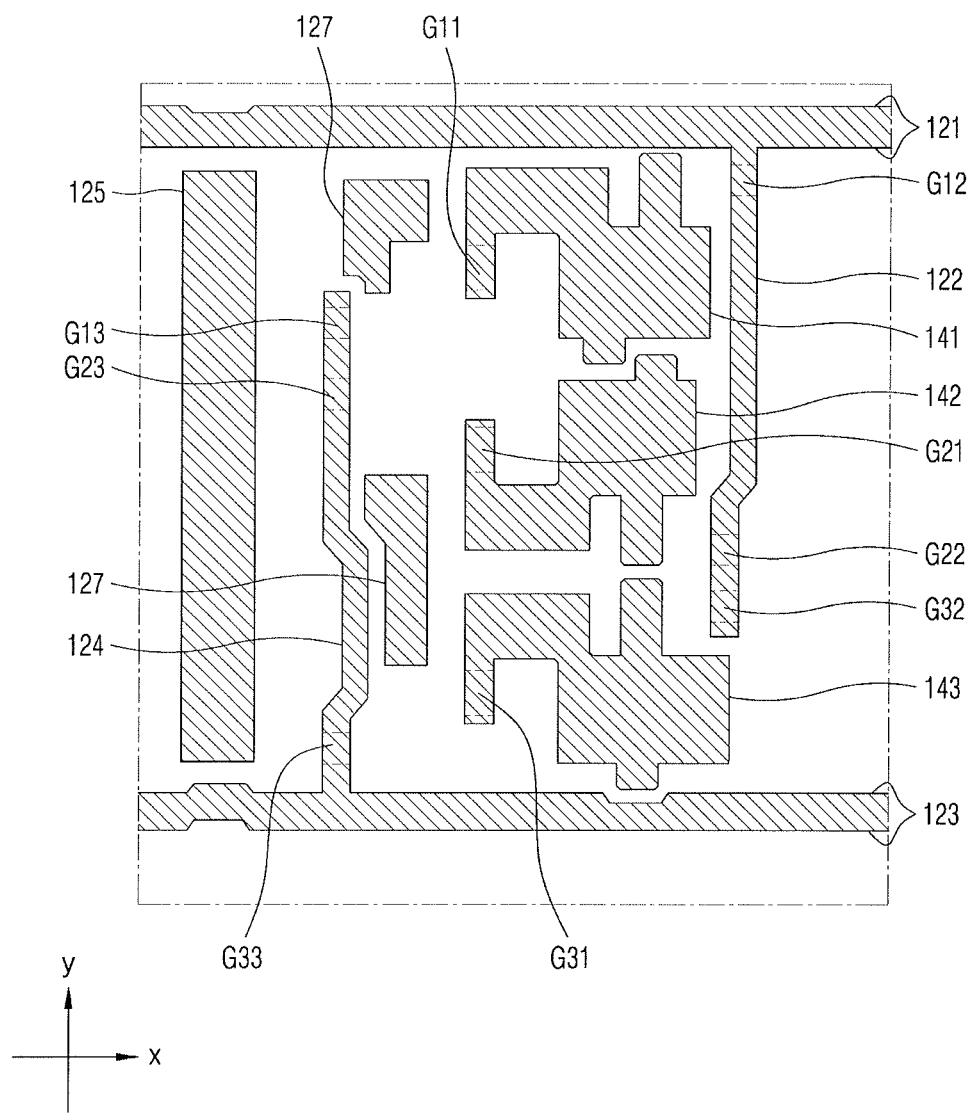

Referring to FIGS. 4, 6, and 9, a scan line 121, a sensing line 123, first, second, and third lower electrode layers 141, 142, and 143, and first and second conductive layers 125 and 127 are on the gate insulating layer 103. The scan line 121, the sensing line 123, the first, second, and third lower electrode layers 141, 142, and 143, and the first and second conductive layers 125 and 127 may include the same materials. For example, the scan line 121, the sensing line 123, the first, second, and third lower electrode layers 141, 142, and 143, and the first and second conductive layers 125 and 127 may include molybdenum (Mo), aluminum (Al), copper (Cu), titanium (Ti), and the like, and may have a single layer or multi-layer structure.

A portion or protruding part of the scan line 121, the sensing line 123, and the first, second, and third lower electrode layers 141, 142, and 143 may correspond to gate electrodes of the TFTs T11 to T33.

In particular, the scan line 121 extends along the row direction (x-direction or second direction), and a first extension line 122 that extends along the column direction (y-direction or first direction) from the scan line 121 is at the first side of the scan line 121. At least a portion of the first extension line 122 may overlap the first switching semiconductor layer ACT12, the second switching semiconductor layer ACT22, and the third switching semiconductor layer ACT32. A portion of the first extension line 122 that overlaps the first switching channel area CA12 corresponds to a first switching gate electrode G12, a portion of the first extension line 122 that overlaps the second switching channel area CA22 corresponds to a second switching gate electrode G22, and a portion of the first extension line 122 that overlaps the third switching channel area CA32 corresponds to a third switching gate electrode G32.

The sensing line 123 extends along the row direction (an x-direction or a second direction), and a second extension line 124 that extends along the column direction (y-direction or first direction) from the sensing line 123 is positioned at one side of the sensing line 123. At least a portion of the second extension line 124 may overlap the first sensing semiconductor layer ACT31, the second sensing semiconductor layer ACT32, and the third sensing semiconductor layer ACT33. A portion of the second extension line 124 that overlaps the first sensing channel area CA13 corresponds to the first sensing gate electrode G13, and a portion of the first extension line 122 that overlaps the second sensing channel area CA23 corresponds to the second sensing gate electrode G23, and a portion of the first extension line 122 that overlaps the third sensing channel area CA33 corresponds to the third sensing gate electrode G33.

In this way, the first switching gate electrode G12, the second switching gate electrode G22, and the third switching gate electrode G32 are formed on a first extension line 122, and the first sensing gate electrode G13, the second sensing gate electrode G23, and the third sensing gate electrode G33 are on the second extension line 124 so that a space may be reduced compared to the case where gate electrodes are formed on different wirings. Thus, pixels suitable for high resolution may be implemented.

The first, second, and third lower electrode layers 141, 142, and 143 may be between the first extension line 122 and the second extension line 124 along the column direction (y-direction or first direction). A portion of the first lower electrode layer 141 that overlaps the first driving channel area CA11 corresponds to the first driving gate electrode G11. A portion of the second lower electrode layer 142 that overlaps the second driving channel area CA21 corresponds to the second driving gate electrode G21. A portion of the third lower electrode layer 143 that overlaps the third driving channel area CA31 corresponds to the third driving gate electrode G31.

The first lower electrode layer 141 is a driving gate electrode and is simultaneously used as a lower storage plate of the first storage capacitor Cst1. The second lower electrode layer 142 is a driving gate electrode and is simultaneously used as a lower storage plate of the second storage capacitor Cst2. The third lower electrode layer 143 is a driving gate electrode and is simultaneously used as a lower storage plate of the third storage capacitor Cst3.

Each of a first conductive layer 125 and a second conductive layer 127 may be in contact with each of a common voltage line 131 and a driving voltage line 135 of FIG. 7 that will be described later so that a phenomenon known as power supply voltage drop (IR drop) in a large-area display apparatus may be alleviated.

An interlayer insulating layer 105 is on the scan line 121, the sensing line 123, the first, second, and third lower electrode layers 141, 142, and 143, and the first and second conductive layers 125 and 127. The interlayer insulating layer 105 may include an inorganic material including an oxide or a nitride. For example, the interlayer insulating layer 105 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_2$), and the like. The interlayer insulating layer 105 may include a layer formed of the above-described inorganic insulating materials and a layer formed of the above-described organic insulating materials.

Figure 7:
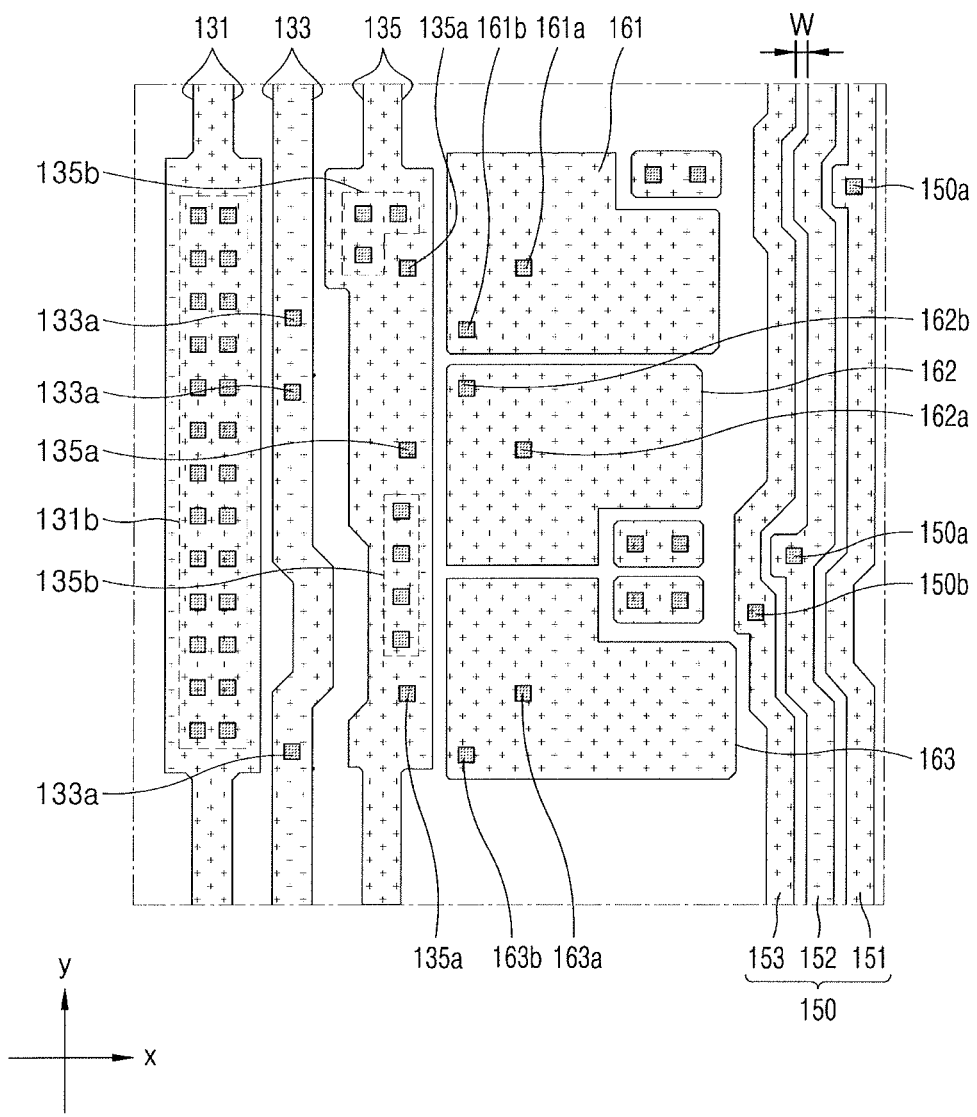

Referring to FIGS. 4, 7, and 9, the common voltage line 131, the initialization voltage line 133, the driving voltage line 135, the data wiring unit 150, and the first, second, and third upper electrode layers 161, 162, and 163 are on the interlayer insulating layer 105. The common voltage line 131, the initialization voltage line 133, the driving voltage line 135, the data wiring unit 150, and the first, second, and third upper electrode layers 161, 162, and 163 may include the same materials. For example, the common voltage line 131, the initialization voltage line 133, the driving voltage line 135, the data wiring unit 150, and the first, second, and third upper electrode layers 161, 162, and 163 may include Mo, Al, Cu, Ti, and the like, and may have a single layer or multi-layer structure. In an example, the common voltage line 131, the initialization voltage line 133, the driving voltage line 135, the data wiring unit 150, and the first, second, and third upper electrode layers 161, 162, and 163 may have a multi-layer structure of Ti/Al/Ti.

The common voltage line 131, the initialization voltage line 133, the driving voltage line 135, and the data wiring unit 150 are positioned to extend along the column direction (y-direction or first direction). The data wiring unit 150 may be on a first side of the first, second, and third upper electrode layers 161, 162, and 163, e.g., spaced apart therefrom along a +x direction, and the common voltage line 131, the initialization voltage line 133, and the driving voltage line 135 may be positioned at a second side of the first, second, and third upper electrode layers 161, 162, and 163, e.g., spaced apart therefrom along a −x direction. In other words, the first, second, and third upper electrode layers 161, 162, and 163, may be between the data wiring unit 150 and the common voltage line 131, the initialization voltage line 133, and the driving voltage line 135 along the x-direction.

The common voltage line 131 is connected to the first conductive layer 125 via a contact hole 131b through the interlayer insulating layer 105. The driving voltage line 135 is connected to the second conductive layer 127 via a contact hole 135b through the interlayer insulating layer 105. In this way, the common voltage line 131 and the driving voltage line 135 have a double layer structure so that an IR drop phenomenon in the large area display apparatus may be alleviated.

The initialization voltage line 133 is connected to a source area or drain area of the first, second, and third sensing semiconductor layers ACT13, ACT23, and ACT33 via a contact hole 133a through the interlayer insulating layer 105.

The driving voltage line 135 is connected to a source area or drain area of each of the first, second, and third driving semiconductor layers ACT11, ACT21, and ACT 31 via a contact hole 135a through the interlayer insulating layer 105.

The first upper electrode layer 161 is connected to a source area or drain area of the first driving semiconductor layer ACT11 via a contact hole 161a through the interlayer insulating layer 105 and is connected to a source area or drain area of the first sensing semiconductor layer ACT13 via a contact hole 161b. The second upper electrode layer 162 is connected to a source area or drain area of the second driving semiconductor layer ACT21 via a contact hole 162a through the interlayer insulating layer 105 and is connected to a source area or drain area of the second sensing semiconductor layer ACT23 via a contact hole 162b. The third upper electrode layer 163 is connected to a source area or drain area of the third driving semiconductor layer ACT31 via a contact hole 163a through the interlayer insulating layer 105 and is connected to a source area or drain area of the third sensing semiconductor layer ACT33 via a contact hole 163b.

The first, second, and third upper electrode layers 161, 162, and 163 are source electrodes or drain electrodes of the first, second, and third driving TFTs T11, T21, and T31 and are simultaneously used as upper storage plates of the first, second, and third storage capacitors Cst1, Cst2, and Cst3. The first, second, and third lower electrode layers 141, 142, and 143 of FIG. 6 overlap the first, second, and third upper electrode layers 161, 162, and 163, respectively, so that first, second, and third storage capacitors Cst1, Cst2, and Cst3 may be formed.

The data wiring unit 150 extends along the column direction (y-direction or first direction) and is connected to a source area or drain area of each of the first, second, and third switching semiconductor layers ACT12, ACT22, and ACT32 via a contact hole 150a through the interlayer insulating layer 105.

The data wiring unit 150 includes a first data line 151, a second data line 12, and a third data line 153. The first data line 151, the second data line 152, and the third data line 153 may be spaced apart from one another by a predetermined distance w along the row direction (x-direction or second direction). For example, in a 65-inch display apparatus, a distance between the first data line 151, the second data line 152 and the third data line 153 may be about 2 μm to about 4 μm, but may be implemented differently according to the size of the display apparatus and the number of pixels.

In the present embodiment, the data wiring unit 150 is on the first side of the first, second, and third storage capacitors Cst1, Cst2, and Cst3, and the driving voltage line 135 is on the second side of the first, second, and third storage capacitors Cst1, Cst2, and Cst3. As the first data line 151, the second data line 152 and the third data line 153 are inclined to one side of the first, second, and third storage capacitors Cst1, Cst2, and Cst3, space utility may be maximized compared to the case where the first data line 151, the second data line 152 and the third data line 153 are positioned between the pixels.

A planarization insulating layer 107 is on the common voltage line 131, the initialization voltage line 133, the data wiring unit 150, and the first, second, and third upper electrode layers 161, 162, and 163. The planarization insulating layer 107 may include an organic material, e.g., acryl, benzocyclobutene (BCB), polyimide, hexamethyldisiloxane (HMDSO), and the like.

Figure 8:
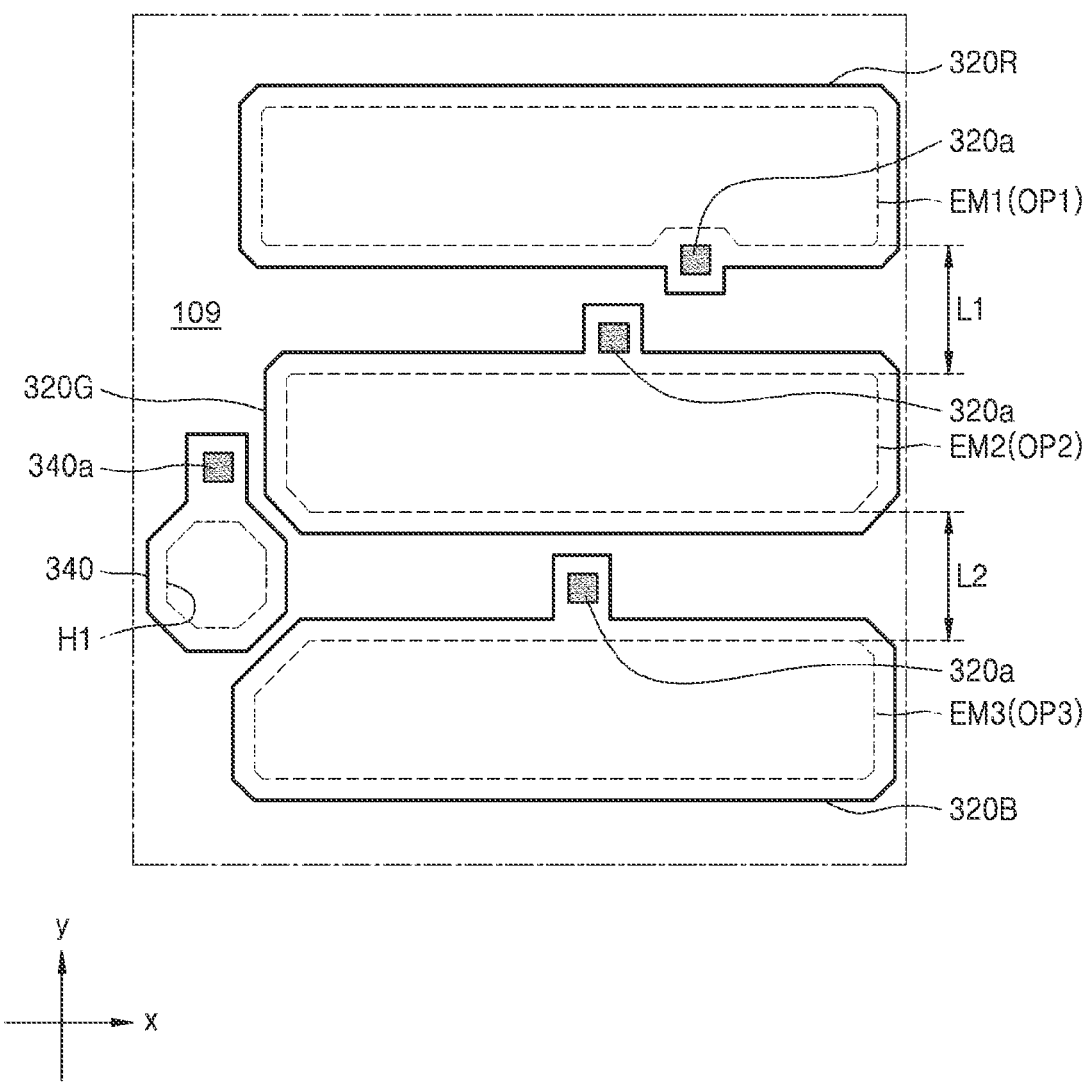
Figure 9:
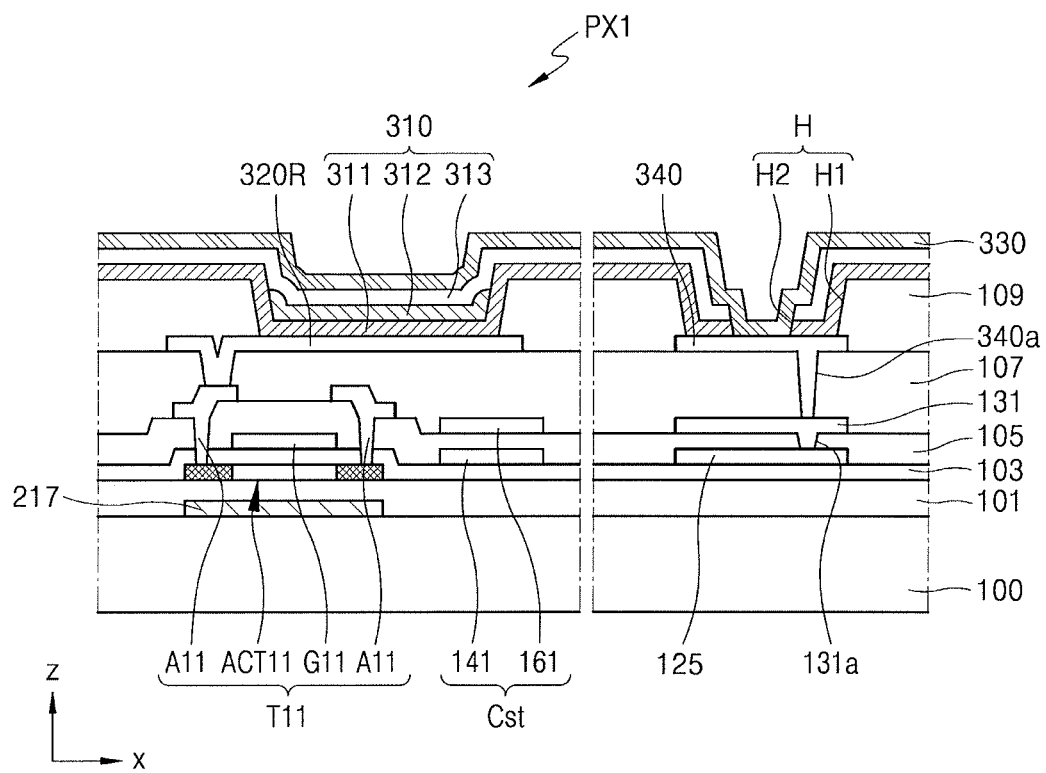
FIG. 9 illustrates a cross-sectional view of a stack structure of a pixel of a display apparatus according to an embodiment.

Referring to FIGS. 4, 8, and 9, first, second, and third pixel electrodes 320R, 320G, and 320B are on the planarization insulating layer 107. The first, second, and third pixel electrodes 320R, 320G, and 320B are connected to the first, second, and third upper electrode layers 161, 162, and 163 via a contact hole 320a defined in the planarization insulating layer 107. The first, second, and third pixel electrodes 320R, 320G, and 320B may be connected to the first, second, and third upper electrode layers 161, 162, and 163 and thus may be connected to source electrodes or drain electrodes of the first, second, and third driving TFTs T11, T21, and T31.

Each of the first, second, and third pixel electrodes 320R, 320G, and 320B may to extend along the row direction (x-direction or second direction). That is, on a plane, each of the first, second, and third pixel electrodes 320R, 320G, and 320B may be provided to have a short axis in the column direction (y-direction or first direction) and a long axis in the row direction (x-direction or second direction).

Each of the first, second, and third pixel electrodes 320R, 320G, and 320B may overlap the data wiring unit 150. That is, each of the first, second, and third pixel electrodes 320R, 320G, 320B may overlap the first data line 151, the second data line 152, and the third data line 153 simultaneously. In the present embodiment, each of the first, second, and third pixel electrodes 320R, 320G, and 320B overlap the first data line 151, the second data line 152, and the third data line 153 simultaneously. However, in another embodiment. at least one of the first, second, and third pixel electrodes 320R, 320G, and 320B may overlap the first data line 151, the second data line 152, and the third data line 153 simultaneously.

At least a portion of each of the first, second, and third pixel electrodes 320R, 320G, and 320B overlaps the driving voltage line 135. Thus, a capacitance $C_{OLED}$ (see FIG. 3) may be increased so that a voltage variation amount stored in the storage capacitor Cst may be minimized to realize a stabilized pixel circuit.

Meanwhile, the first, second, and third pixel electrodes 320R, 320G, and 320B are positioned not to overlap the scan line 121. In FIG. 4, as the first pixel electrode 230R does not overlap the scan line 121, an increase in loads caused by a capacitance between the first pixel electrode 230R and the scan line 121 may be minimized.

The first, second, and third pixel electrodes 320R, 320G, and 320B may be reflective electrodes. For example, the first, second, and third pixel electrodes 320R, 320G, and 320B may include a reflective layer formed of silver (Ag), magnesium (Mg), Al, platinum (Pt), palladium (Pd), gold (Au), nickel (Ni), neodymium (Nd), iridium (Ir), chromium (Cr), a compound thereof, and the like, and a transparent or semitransparent electrode layer formed on the reflective layer. The transparent or semitransparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

An insulating layer (see 109 of FIG. 9) for defining emission areas EM1 EM2, and EM3 is positioned on the first, second, and third pixel electrodes 320R, 320G, and 320B. The insulating layer 109 includes a plurality of openings for defining the emission areas EM1, EM2, and EM3, and each of the emission areas EM1, EM2, and EM3 is defined by first, second, and third openings OP1, OP2, and OP3. For example, the insulating layer 109 may include one or more organic insulating materials, e.g., polyimide, polyamide, acryl resin, BCB, phenol resin, and th.

Referring to FIG. 8, a width L1 of the insulating layer 109 between the first opening OP1 and the second opening OP2 in the row direction (x-direction or second direction) may be the same as a width L2 of the insulating layer 109 between the second opening OP2 and the third opening OP3 in the row direction (x-direction or second direction). In this way, a width of the insulating layer 109 is the same in each pixel so that a problem of color mixture in a light leakage phenomenon may be effectively solved through the insulating layer 109.

FIG. 9 illustrates a cross-section of one pixel. Cross-sectional structures of a plurality of pixels PX1, PX2, and PX3 are similar to one another. Thus, FIG. 9 illustrates the first pixel PX1 as one example.

Referring to FIG. 9, an intermediate layer 310 is on the first pixel electrode 320R exposed by the insulating layer 109. The intermediate layer 310 may include an emission layer 312. The emission layer 312 may include an organic material including a fluorescent or phosphorescent material that emits red, green, blue or white light. The intermediate layer 310 may include a small molecular weight organic material, a polymer organic material, and the like.

Functional layers 311 and 313, such as a hole transport layer (HTL), a hole injection layer (HIL), an electron transport layer (LTL), and an electron injection layer (EIL), may be optionally further positioned under/on the emission layer 312.

An opposite electrode 330 may be a light-transmitting electrode. For example, the opposite electrode 330 may be a transparent or semitransparent electrode and may be formed of a metallic thin film having a low work function including Li, Ca, LiF/Ca, LiF/Al, Al, Ag, Mg, a compound thereof, and the like. Also, a transparent conductive oxide (TCO) layer, such as ITO, IZO, ZnO, $In_2O_3$, and the like, may be further positioned on the metallic thin film.

Referring back to FIGS. 8 and 9, an auxiliary electrode 340 is at the second side of the first, second, and third pixel electrodes 320R, 320G, and 320B. The auxiliary electrode 340 may be electrically connected to the common voltage line 131 via a contact hole 340a defined in the planarization insulating layer 107 in a downward direction and may be electrically connected to the opposite electrode 330 via a contact hole H in an upward direction.

The through hole H includes a first hole H1 through the insulating layer 109 and a second hole H2 through the functional layers 311 and 313 of the intermediate layer 310. The first hole H1 may be simultaneously formed with an opening for exposing the pixel electrode 320 and the second hole H2 may be formed through laser drilling, for example. When the functional layers 311 and 313 are formed on the entire surface of the substrate 100 similarly to the opposite electrode 330, the functional layers 311 and 313 on the auxiliary electrode 340 have to be removed so that the auxiliary electrode 340 and the opposite electrode 330 may be in contact with each other. Thus, the second hole H2 may be formed by radiating laser onto the functional layers 311 and 313 so that the auxiliary electrode 340 and the opposite electrode 330 may be electrically connected to each other.

The auxiliary electrode 340 may be connected to the opposite electrode 330 via the first hole H1 through the insulating layer 109 and the second hole H2 through the functional layers 311 and 313 excluding the emission layer from the intermediate layer 310. Through the auxiliary electrode 340, the IR drop phenomenon in the large area display apparatus may be alleviated.

Figure 10:
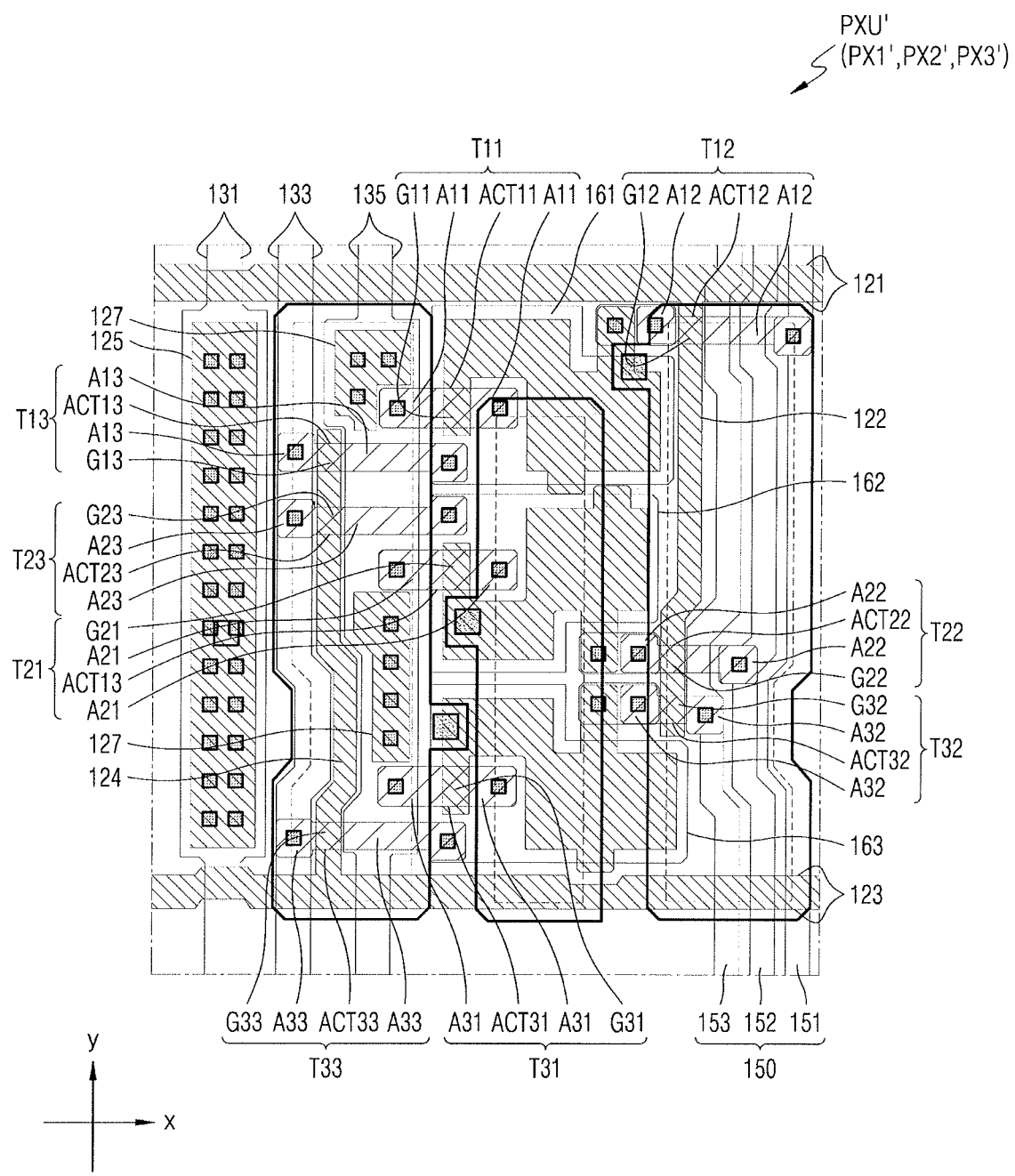
FIG. 10 illustrates a layout diagram of a pixel unit including a pixel circuit of a display apparatus according to another embodiment.

FIG. 10 is a layout diagram of a pixel circuit of a pixel unit PXU' of a display apparatus according to another embodiment. Referring to FIG. 10, the present embodiment is different from the above-described embodiment by arrangement of a plurality of pixels PX1, PX2, and PX3, in detail, arrangement of first, second, and third pixel electrodes 320R, 320G, and 320B. In the embodiment of FIG. 10, the first, second, and third pixel electrodes 320R, 320G, and 320B extend along the column direction (y-direction or first direction). The configuration of layers under the first, second, and third pixel electrodes 320R, 320G, and 320B may be the same as that of the above-described embodiment.

Herein, the display apparatus has been mainly described. However, embodiments are not limited thereto. For example, a method of manufacturing the display apparatus also belongs to the scope of embodiments.

As described above, according to embodiments, a display apparatus, whereby an opening ratio is easily obtained at a high resolution and luminous quality is improved, may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a substrate;
a first thin-film transistor (TFT) and a first capacitor positioned on the substrate;
a data wiring unit at a first side of the first capacitor in a plan view, the data wiring unit extending along a first direction, the data wiring unit including a first data line, a second data line, and a third data line, the first data line, the second data line, and the third data line being spaced apart from one another by a predetermined distance along a second direction that intersects the first direction;
a driving voltage line at a second side of the first capacitor in a plan view, the driving voltage line electrically connected to the first capacitor and extending along the first direction;
a first pixel electrode electrically connected to the first TFT;
a scan line extending in the second direction;
a first extension line extending in the first direction from the scan line; and
a first switching TFT comprising a first switching semiconductor layer for emitting the light having a first color, a second switching TFT comprising a second switching semiconductor layer for emitting the light having a second color, and a third switching TFT comprising a third switching semiconductor layer for emitting the light having a third color, wherein
at least a portion of the first extension line overlaps the first switching semiconductor layer, the second switching semiconductor layer, and the third switching semiconductor layer, and
the driving voltage line is spaced apart from the first capacitor in a plan view.

2. The display apparatus as claimed in claim 1, wherein, on a plane, the first pixel electrode has a short axis in the first direction and a long axis in the second direction, the first pixel electrode extending along the second direction.

3. The display apparatus as claimed in claim 1, wherein the first pixel electrode overlaps the data wiring unit.

4. The display apparatus as claimed in claim 3, wherein the first pixel electrode overlaps the first data line, the second data line, and the third data line.

5. The display apparatus as claimed in claim 1, wherein the first switching TFT is connected to the first data line.

6. The display apparatus as claimed in claim 1, further comprising a common voltage line at the second side of the first capacitor, the common voltage line being spaced apart from the driving voltage line along the second direction by a predetermined distance and extending along the first direction, wherein the common voltage line is spaced apart from the first capacitor in a plan view.

7. The display apparatus as claimed in claim 6, further comprising a first conductive layer below the common voltage line, wherein the common voltage line is connected to the first conductive layer via a contact hole.

8. The display apparatus as claimed in claim 7, further comprising a second conductive layer below the driving voltage line, wherein the driving voltage line is connected to the second conductive layer via a contact hole.

9. The display apparatus as claimed in claim 8, wherein the first conductive layer and the second conductive layer include same materials.

10. The display apparatus as claimed in claim 6, further comprising an initialization voltage line between the driving voltage line and the common voltage line and extending along the first direction.

11. The display apparatus as claimed in claim 6, further comprising:
an intermediate layer including a first color emission layer on the first pixel electrode;
an opposite electrode on the intermediate layer; and
an auxiliary electrode at the first side or the second side of the first pixel electrode and electrically connected to the common voltage line, wherein
the auxiliary electrode is electrically connected to the opposite electrode.

12. The display apparatus as claimed in claim 11, further comprising:
an insulating layer that includes a first hole exposing a central part of the auxiliary electrode, wherein
the intermediate layer further includes a second hole exposing at least a portion of the auxiliary electrode via the first hole, and
the auxiliary electrode is electrically connected to the opposite electrode via the first hole and the second hole.

13. The display apparatus as claimed in claim 1, further comprising:
a second TFT positioned on the substrate for controlling emission of light of the second color with a second capacitor and a second pixel electrode electrically connected to the second TFT; and
a third TFT positioned on the substrate for controlling emission of light of the third color with a third capacitor and a third pixel electrode electrically connected to the third TFT, wherein
on a plane, the second capacitor and the third capacitor are positioned between the data wiring unit and the driving voltage line.

14. The display apparatus as claimed in claim 13, wherein
each of the first TFT, the second TFT, and the third TFT is a driving TFT, and
the driving voltage line supplies a same driving voltage to the first TFT, the second TFT, and the third TFT.

15. The display apparatus as claimed in claim 13, wherein each of the second pixel electrode and the third pixel electrode has a short axis in the first direction and a long axis in a second direction that intersects with the first direction, each of the second pixel electrode and the third pixel electrode extending in the second direction.

16. The display apparatus as claimed in claim 13, further comprising a sensing line extending in the second direction, wherein the scan line does not overlap the first pixel electrode.

17. The display apparatus as claimed in claim 1, further comprising:
a second extension line extending in the first direction from the sensing line; and
a first sensing TFT comprising a first sensing semiconductor layer for emitting the light having the first color, a second sensing TFT comprising a second sensing semiconductor layer for emitting the light having the second color, and a third sensing TFT comprising a third sensing semiconductor layer for emitting the light having the third color, wherein
at least a portion of the second extension line overlaps the first sensing semiconductor layer, the second sensing semiconductor layer, and the third sensing semiconductor layer.

18. The display apparatus as claimed in claim 13, further comprising an insulating layer including a first opening covering edges of the first pixel electrode and exposing a central part thereof, a second opening covering edges of the second pixel electrode and exposing a central part thereof, and a third opening covering edges of the third pixel electrode and exposing a central part thereof, wherein
a width of the insulating layer between the first opening and the second opening in the first direction is same as a width of the insulating layer between the second opening and the third opening in the first direction.

19. The display apparatus as claimed in claim 1, wherein at least one of the first color, the second color, and the third color is blue.

20. The display apparatus as claimed in claim 1, wherein at least one of the first color, the second color, and the third color is blue, and an other of the first color, the second color, and the third color is green.

* * * * *